(12) United States Patent
Chao et al.

(10) Patent No.: US 9,197,090 B2
(45) Date of Patent: Nov. 24, 2015

(54) SYSTEM OF COMMUNICATION BETWEEN STACKED INTEGRATED CIRCUITS POWERED BY DIFFERENT VOLTAGE SUPPLY LEVELS IN MULTIPLE CELL-STACKED BATTERY PACK

(71) Applicant: HYCON TECHNOLOGY CORP., Taipei (TW)

(72) Inventors: Po Yin Chao, Taipei (TW); Chuan Sheng Wang, Taipei (TW); Kuo Yuan Yuan, Taipei (TW)

(73) Assignee: Hycon Technology Corp., Taipei (TW)

( * ) Notice: Subject to any disclaimer, the term of this patent is extended or adjusted under 35 U.S.C. 154(b) by 106 days.

(21) Appl. No.: 14/196,015

(22) Filed: Mar. 4, 2014

(65) Prior Publication Data

US 2015/0255997 A1 Sep. 10, 2015

(51) Int. Cl.
*H02J 7/00* (2006.01)
(52) U.S. Cl.
CPC ............... *H02J 7/007* (2013.01); *H02J 7/0021* (2013.01)
(58) Field of Classification Search
CPC ........................................................ H02J 7/0031
USPC .......................................................... 320/134
See application file for complete search history.

(56) References Cited

U.S. PATENT DOCUMENTS

| | | | |
|---|---|---|---|
| 2006/0071643 A1* | 4/2006 | Carrier | H01M 10/4257 320/132 |
| 2007/0182377 A1 | 8/2007 | Vandensande | |
| 2011/0001456 A1* | 1/2011 | Wang | H02J 7/0016 320/117 |

OTHER PUBLICATIONS

Office action issued by Taiwanese patent office on Jun. 17, 2015, for the US counterpart case.

* cited by examiner

*Primary Examiner* — Suresh Memula
(74) *Attorney, Agent, or Firm* — Che-Yang Chen; Law Office of Michael Chen

(57) ABSTRACT

A system of communication between stacked integrated circuits powered by different voltage supply levels in a multiple cell-stacked battery pack is disclosed. The system includes a number of battery cells and a number of integrated circuits. Each integrated circuit includes a battery detecting unit, a data transceiving unit and a power acquiring unit. Since the data transceiving unit transmits signals by toggling voltage level, current flow which causes higher power consumption can be avoided. Meanwhile, the system of communication can therefore be applied to many internal communicating protocols.

9 Claims, 5 Drawing Sheets

SYSTEM OF COMMUNICATION BETWEEN STACKED INTEGRATED CIRCUITS POWERED BY DIFFERENT VOLTAGE SUPPLY LEVELS IN MULTIPLE CELL-STACKED BATTERY PACK

FIELD OF THE INVENTION

The present invention relates to a system of communication. More particularly, the present invention relates to a system of communication between stacked circuits powered by different voltage supply levels in a multiple cell-stacked battery pack.

BACKGROUND OF THE INVENTION

Rechargeable batteries are widely used in many products, such as notebooks, tablets, mobile phones, and even large electric vehicles. Generally, rechargeable batteries are composed of a number of rechargeable battery cells linked in series or parallel with the same spec to fulfill a certain power supply. Since each rechargeable battery cell may have unique physical conditions, such as power capacity, when many rechargeable battery cells linked together to work (charge or discharge), difference between two rechargeable battery cells will cause battery unbalance. The battery unbalance situation can further lead to shortening of rechargeable battery life. Therefore, Battery Management Systems (BMS) are used to monitor conditions of rechargeable battery cells and provide actions to treat battery unbalance situation.

It is sure that functions of a BMS are not limited to those mentioned above. With increasing quantity of rechargeable battery cells used in a rechargeable battery, design of the BMS becomes complex. If one BMS can not work to fulfill the purpose of management of all rechargeable battery cells, a number of BMS' must linked to co-work or a BMS has to work with the aid of several sub-units. A popular concept of BMS operation is to apply master-slave control communication. A solution is provided in U.S. Pat. No. 8,237,405. '405 discloses a battery management system which can include a rechargeable battery having a number of rechargeable battery cells, a number of devices coupled to the rechargeable battery, and a control unit coupled to a first device of the devices. The devices can assess the statuses of the rechargeable battery cells. The control unit can communicate with a destination device of the devices via a default path and can communicate with the destination device via a backup path if an undesirable condition occurs in the default path.

A feature of the '405 is the communicating method applied in the battery management system. The communicating method uses master-slave control and can make the battery management system extensible to large number of linked battery cells. However, under such architecture, signals communicated is achieved by current and charge transfer. It will cause high power consumption. Meanwhile, '405 is not able to apply to many popular protocols for internal communication.

Therefore, a master-slave control type system of communication which can consume less power and apply to many popular internal communicating protocols is still desired. The system of communication functions well in a BMS.

SUMMARY OF THE INVENTION

The known master-slave control type of communication systems for Battery Management Systems (BMS) consume higher power and are applied to limited internal communicating protocols. Therefore, a master-slave control type system of communication which can consume less power and apply to many popular internal communicating protocols is desired. The system of communication functions well in a BMS.

According to an aspect of the present invention, a system of communication between stacked integrated circuits powered by different voltage supply levels in a multiple cell-stacked battery pack includes: a plurality of battery cells, stacked to provide power; a plurality of integrated circuits, each linking to at least one of other integrated circuits and comprising: a battery detecting unit for monitoring battery statuses of two adjacent battery cells in the plurality of battery cells and retrieving the battery statuses therefrom; a data transceiving unit, electrically connected with the battery detecting unit, for receiving a clock signal and a requiring command from an outside device or an integrated circuit linked in upstream side and a reply message from an integrated circuit linked in downstream side, transmitting the reply message and/or a response message to the integrated circuit linked in upstream side, the clock signal to the integrated circuit linked in downstream side and the requiring command to the integrated circuit linked in downstream side if the requiring command needs to send to one integrated circuit in downstream side, and stopping transmitting the clock signal if no other integrated circuit linked in downstream side; and a power acquiring unit, electrically connecting with the battery detecting unit and data transceiving unit for providing power thereto so as to operate the battery detecting unit and data transceiving unit. The response message is generated if the requiring command requests. The reply message is sent from another data transceiving unit in one integrated circuit in downstream side. The clock signal, requiring command, reply message and response message are in form of change of voltage levels. The integrated circuit linked in the end of upstream side receives the clock signal and requiring command from the outside device and transmits the reply message and/or a response message according to the requiring command about the battery statuses to the outside device.

Preferably, the integrated circuits are linked by connecting the data transceiving units via circuitry in a printed circuit board.

Preferably, the power acquiring unit links to the two adjacent battery cells to obtain power.

Preferably, power from one of the linked battery cells supports communicating of the clock signal, requiring command, reply message or response message with one integrated circuit in upstream side while power from the other of the linked battery cells supports communicating of the clock signal, requiring command, reply message or response message with one integrated circuit in downstream side.

Preferably, receiving and transmitting of the clock signal, requiring command, reply message or response message conform to Inter-Integrated Circuit protocol or Service Provider Interface protocol.

Preferably, the data transceiving unit transmits the clock signal, requiring command, reply message or response message by toggling voltage level thereof.

Preferably, the clock signal triggers receiving and transmitting of the requiring command, reply message or response message between integrated circuits.

Preferably, the integrated circuit is packaged or in the form of a die.

Preferably, the outside device is a controller.

Since the data transceiving unit transmits the clock signal, requiring command, reply message or response message by toggling voltage level, current flow which causes higher power consumption can be avoided. Meanwhile, the system of communication can therefore be applied to a number of internal communicating protocols.

DETAILED DESCRIPTION OF THE PREFERRED EMBODIMENT

Figure 1:
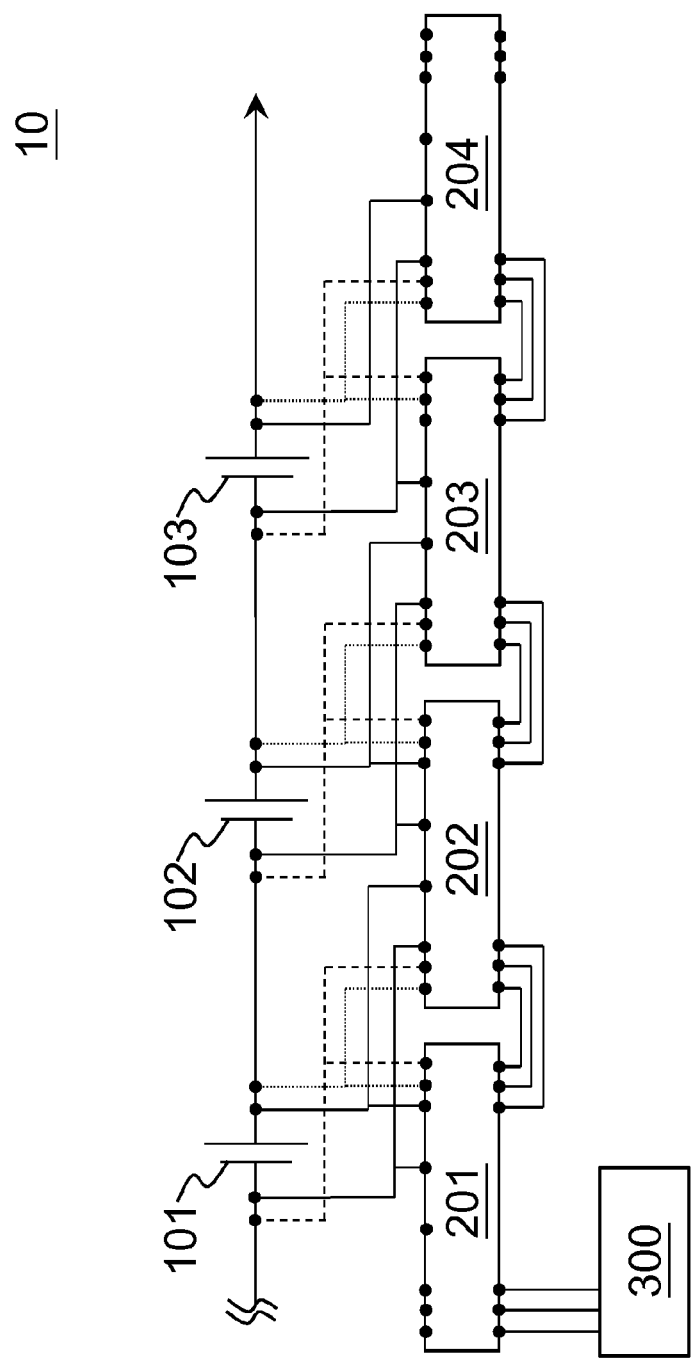
FIG. 1 is a block diagram of a system of communication between stacked integrated circuits powered by different voltage supply levels in a multiple cell-stacked battery pack according to an embodiment of the present invention.
Figure 2:
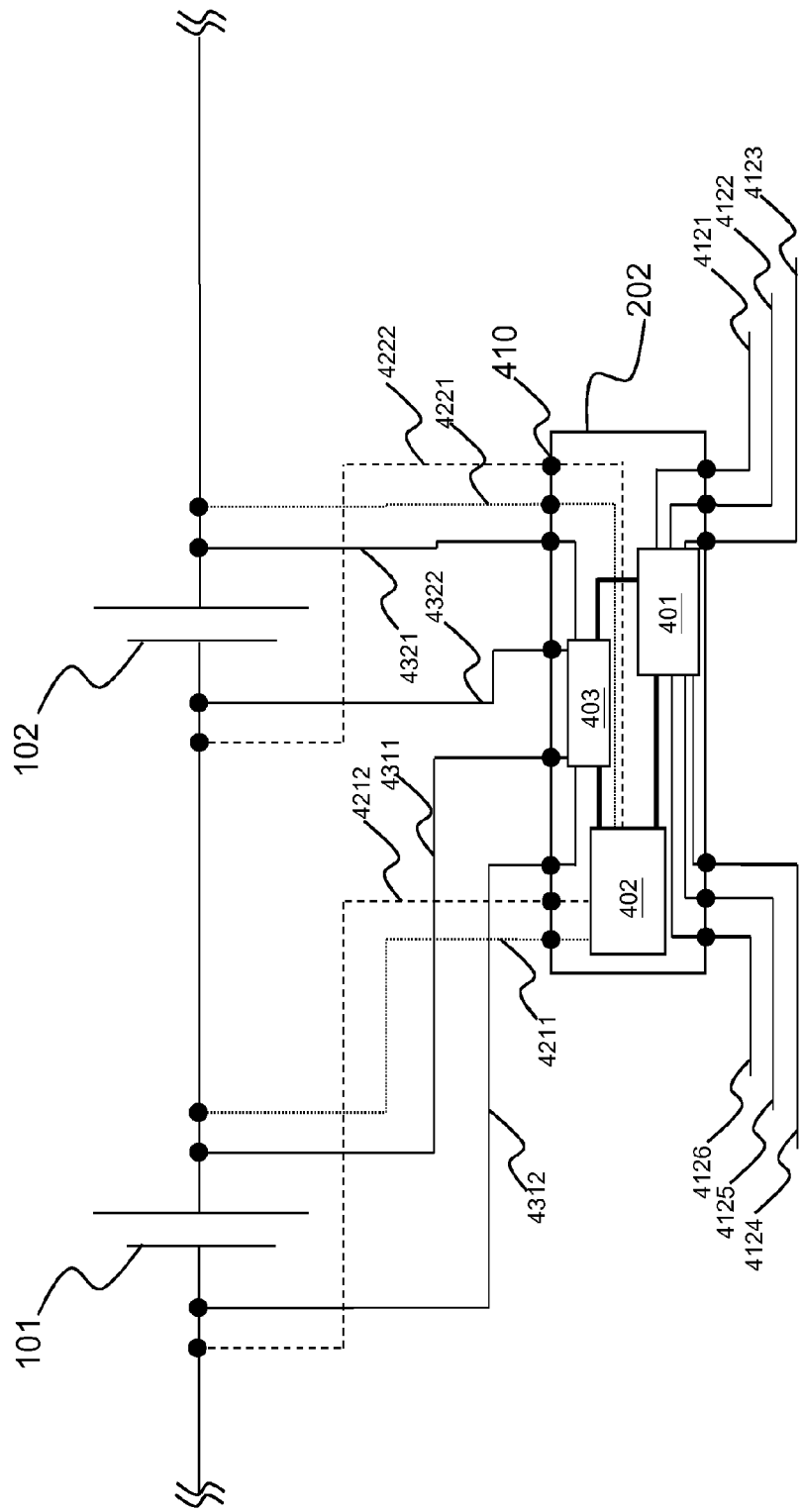
FIG. 2 is a block diagram of a portion of the system.

The present invention will now be described more specifically with reference to the following embodiment.
Please refer to FIG. 1 to FIG. 5. FIG. 1 is a block diagram of a system of communication between stacked integrated circuits powered by different voltage supply levels in a multiple cell-stacked battery pack according to an embodiment of the present invention. FIG. 2 to FIG. 5 are block diagrams for different portion of the system in FIG. 1.
A system 10 of communication between stacked integrated circuits powered by different voltage supply levels in a multiple cell-stacked battery pack is shown in FIG. 1. The system 10 can play a role as a battery management system. The systems includes 3 battery cells (a first battery cell 101, a second battery cell 102 and a third battery cell 103) and 4 integrated circuits (a first integrated circuit 201, a second integrated circuit 202, a third integrated circuit 203 and a fourth integrated circuit 204). The system 10 is further linked with a controller 300. The first battery cell 101, second battery cell 102 and third battery cell 103 are linked in series (stacked) to provide power. The 3 battery cells compose a core of a battery. The arrow shows current direction of the battery. In order to have a better illustration of the embodiment, current direction (from left to right) is used to indicate two linked battery cells or integrated circuits. One battery cell (or integrated circuit) locates in upstream side if it is in the left side of the other battery cell (or integrated circuit). On the contrary, one battery cell (or integrated circuit) locates in downstream side if it is in the right side of the other battery cell (or integrated circuit). For example, the first battery cell 101 is in the upstream side of the second battery cell 102, the third integrated circuit 203 is in the downstream side of the second integrated circuit 202, etc. According to the present invention, the number of the battery cells may be greater than or equal to two. The embodiment employs three just for description purpose. The battery cells can be primary or secondary (rechargeable). It is not limited in the present invention.
The integrated circuits are linked in series (stacked). Therefore, each of them links to at least one of other integrated circuits. It means that there are two integrated circuits located in the most upstream end (the first integrated circuit 201) and the most downstream side (the fourth integrated circuit 204). The two integrated circuits have different operation than other integrated circuits. This will be described in detailed later.
According to the present embodiment, every integrated circuits are identical in hardware design but different in operation. Please refer to FIG. 2. The second integrated circuit 202 with the first battery cell 101 and second battery cell 102 are cut from the system 10 and taken for example to show the design of one integrated circuit and how it works. In this embodiment, the integrated circuits are all packaged. It means the integrated circuit is packaged within protective material, such as epoxy, and links to external circuitry via a number of pins. According to the spirit of the present invention, the integrated circuits can be in the form of dies. They can link to external circuitry by wire bondings. In FIG. 2, there are 10 pins 410 of the integrated circuit 202. It should be noticed that the number of pins 410 is not limited to 10. It depends on the design and other functions of the integrated circuits.

The second integrated circuit 202 includes a data transceiving unit 401, a battery detecting unit 402 and a power acquiring unit 403. The battery detecting unit 402 can monitor battery statuses, such as voltage difference, current value, temperature, etc., of two adjacent battery cells and retrieve the battery statuses from the battery cells. In FIG. 2, the battery detecting unit 402 monitor battery statuses of the first battery cell 101 and second battery cell 102 and retrieve the battery statuses from the two battery cells. In fact, it is the second integrated circuit 202 which monitors battery statuses of the first battery cell 101 and second battery cell 102 and retrieves the battery statuses from the two battery cells. Likewise, the third integrated circuit 203 monitors battery statuses of the second battery cell 102 and third battery cell 103 and retrieves the battery statuses from the two battery cells. The battery detecting unit 402 links to a first anode detecting line 4211 connecting an anode of the first battery cell 101, and a first cathode detecting line 4212 connecting a cathode of the first battery cell 101 to process monitoring and retrieving (collected as detecting). It also links to a second anode line 4221 connecting an anode of the second battery cell 102, and a second cathode line 4222 connecting a cathode of the second battery cell 102 to process detecting.

The data transceiving unit 401 is electrically connected with the battery detecting unit 402. It can receive a clock signal via a upstream clock line 4126, a requiring command from the first integrated circuit 201 linked in upstream side via an upstream input line 4125, and a reply message from the third integrated circuit 203 linked in downstream side via a downstream input line 4123. The data transceiving unit 401 can also transmit the reply message and/or a response message about the battery statuses of the detected battery cell (the first battery cell 101 and/or second battery cell 102) to the first integrated circuit 201 linked in upstream side via a upstream output line 4124, the clock signal to the third integrated circuit 203 linked in downstream side via a downstream clock line 4121, and the requiring command to the third integrated circuit 203 linked in downstream side via a downstream output line 4122 if the requiring command needs to send to one integrated circuit in downstream side, for example, to the fourth integrated circuit 204. The response message is generated if the requiring command requests. The reply message is sent from another data transceiving unit in the third integrated circuit 203 in downstream side. It should be noticed that the clock signal, requiring command, reply message and response message are in form of change of voltage levels. The data transceiving unit in each integrated circuit transmits the clock signal, requiring command, reply message or response message by toggling voltage level thereof It avoids defect of current flow from one integrated circuit to another so that power consumption can be less compared with conventional digital communication methods.

The power acquiring unit 403 is electrically connected with the battery detecting unit 402 and data transceiving unit 401 to provide power. Therefore, the battery detecting unit 402 and data transceiving unit 401 can be operated. The power acquiring unit 403 links to the first battery cell 101 and the second battery cell 102 to obtain power. It is linked to a first power supply line 4311 connecting the anode of the first battery cell 101, and a first ground line 4312 connecting the cathode of the first battery cell 101 as well as the a second power supply line 4321 connecting the anode of the second battery cell 102, and a second ground line 4322 connecting the cathode of the second battery cell 102.

It should notice that power from the linked first battery cell 101 (in upstream side) supports communicating of the clock signal, requiring command, reply message or response message with the first integrated circuit 201 (in upstream side). It means with power from the first battery cell 101, communication via the upstream output line 4124, upstream input line 4125, and upstream clock line 4126 can be implemented. Similarly, power from the linked second battery cell 102 (in downstream side) supports communicating of the clock signal, requiring command, reply message or response message with the second integrated circuit 202 (in downstream side). As well, communication via the downstream clock line 4121, downstream output line 4122, and downstream input line 4123 can be implemented.

When two integrated circuits are linked to work, there are three kinds of situations: both of two integrated circuits link to other integrated circuits in the upstream side and downstream side; one integrated circuit links to no integrated circuit in upstream side; one integrated circuit links to no integrated circuit in downstream side. These three situations are illustrated in FIG. 3 to FIG. 5, respectively.

Figure 3:
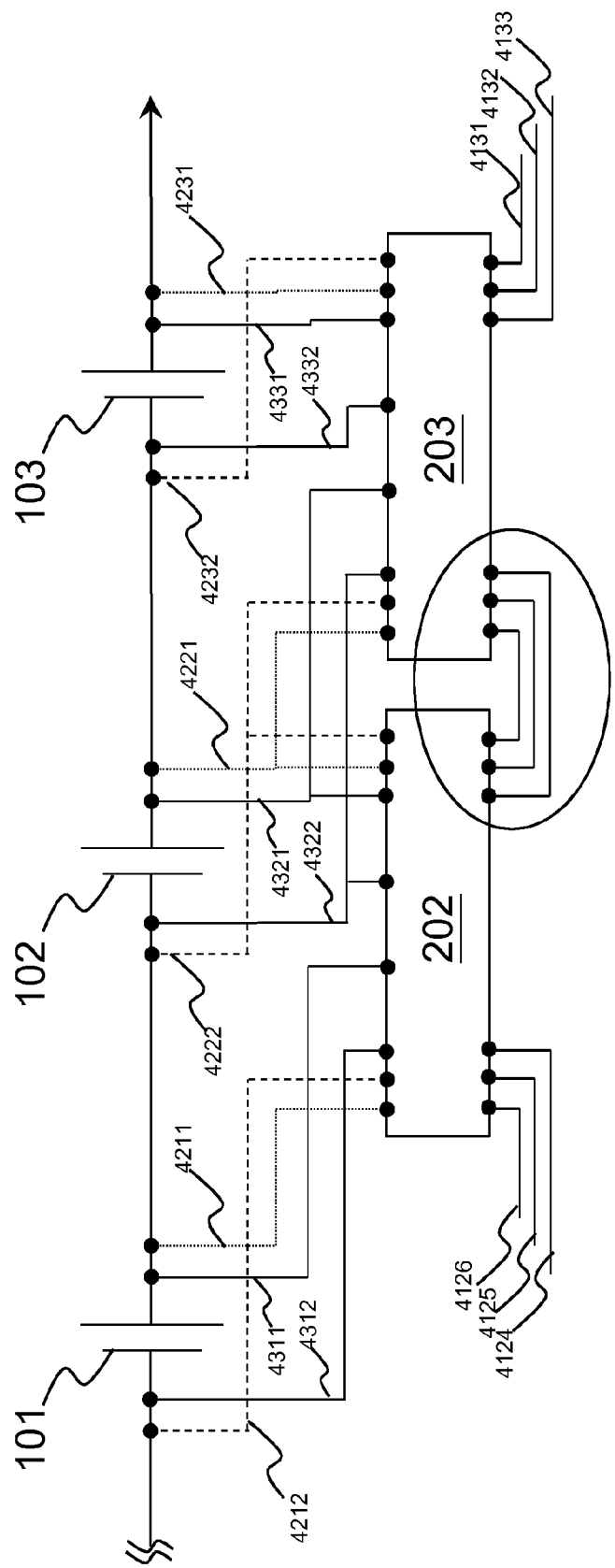
FIG. 3 is a block diagram of another portion of the system.

Please refer to FIG. 3. The second integrated circuit 202 and third integrated circuit 203 are linked to communication in between. In order to simplify illustration and have better understanding, no matter what number it is, items having the same name have the same functions (appearance may not the same), for example, 'downstream input line' 4133 has the same functions as 'downstream input line' 4123, and so on.

The second battery cell 102 and third battery cell 103 are used to provide power. The downstream clock line 4121, downstream output line 4122, and downstream input line 4123 are linked to an upstream clock line, an upstream input line, and an upstream output line where (marked by an ellipse) a data transceiving unit of the third integrated circuit 203 is linked to so that communication can be operated in between. The third integrated circuit 203 further links to a downstream clock line 4131, a downstream output line 4132, and a downstream input line 4133 to communicate with the fourth integrated circuit 204. That is upstream lines of one integrated circuit are linked to corresponding downstream lines of the other integrated circuit to build up communication channels in between. Meanwhile, the third integrated circuit 203 links to the second anode line 4221 connecting the anode of the second battery cell 102 and the second cathode line 4222 connecting the cathode of the second battery cell 102 to process detecting the second battery cell 102, and to a third anode line 4231 connecting an anode of a third battery cell 103 and a third cathode line 4232 connecting a cathode of the second battery cell 103 to process detecting the third battery cell 103. As well, it is linked to the second power supply line 4321 connecting the anode of the second battery cell 102, the second ground line 4322 connecting the cathode of the second battery cell 102, a third power supply line 4331 connecting an anode of the third battery cell 103, and a third ground line 4332 connecting a cathode of the third battery cell 103 to get power for operation.

Figure 4:
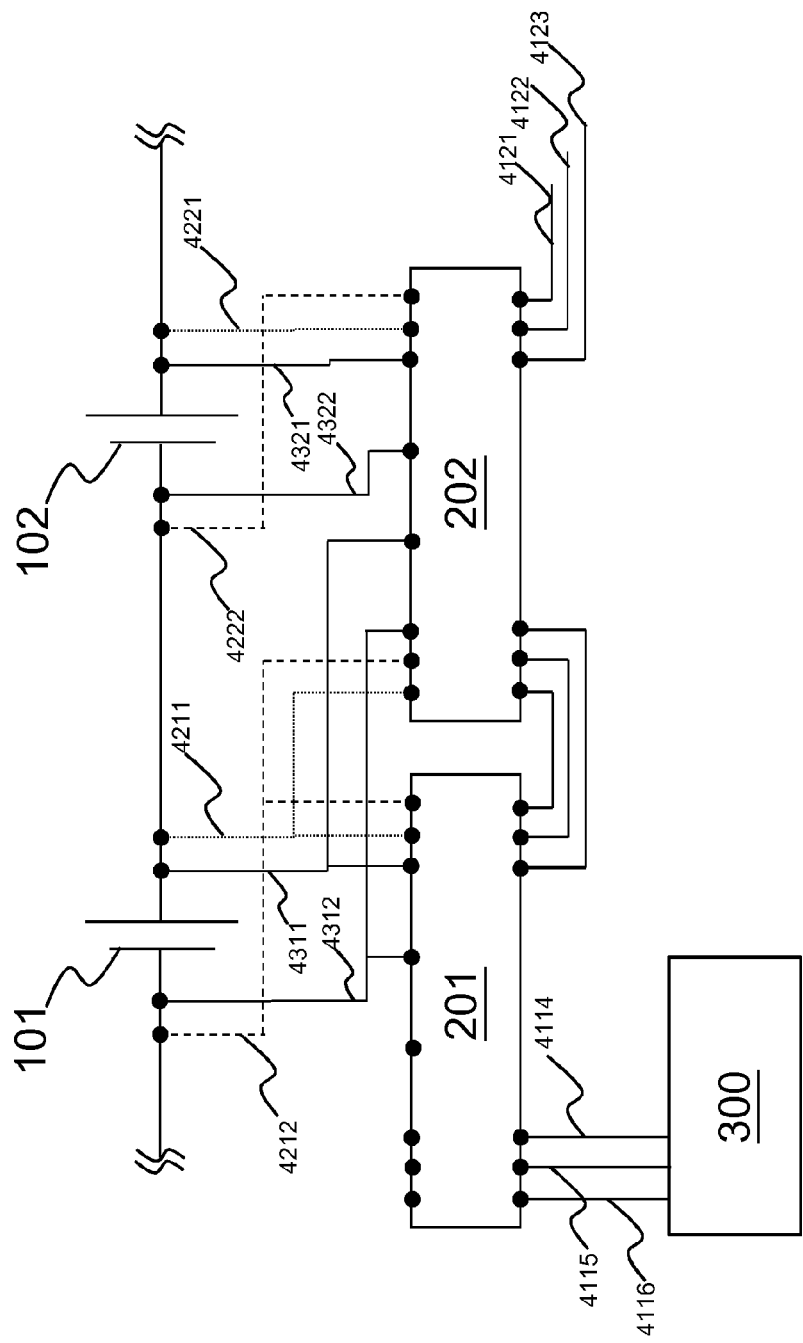
FIG. 4 is a block diagram of still a portion of the system.
Figure 5:
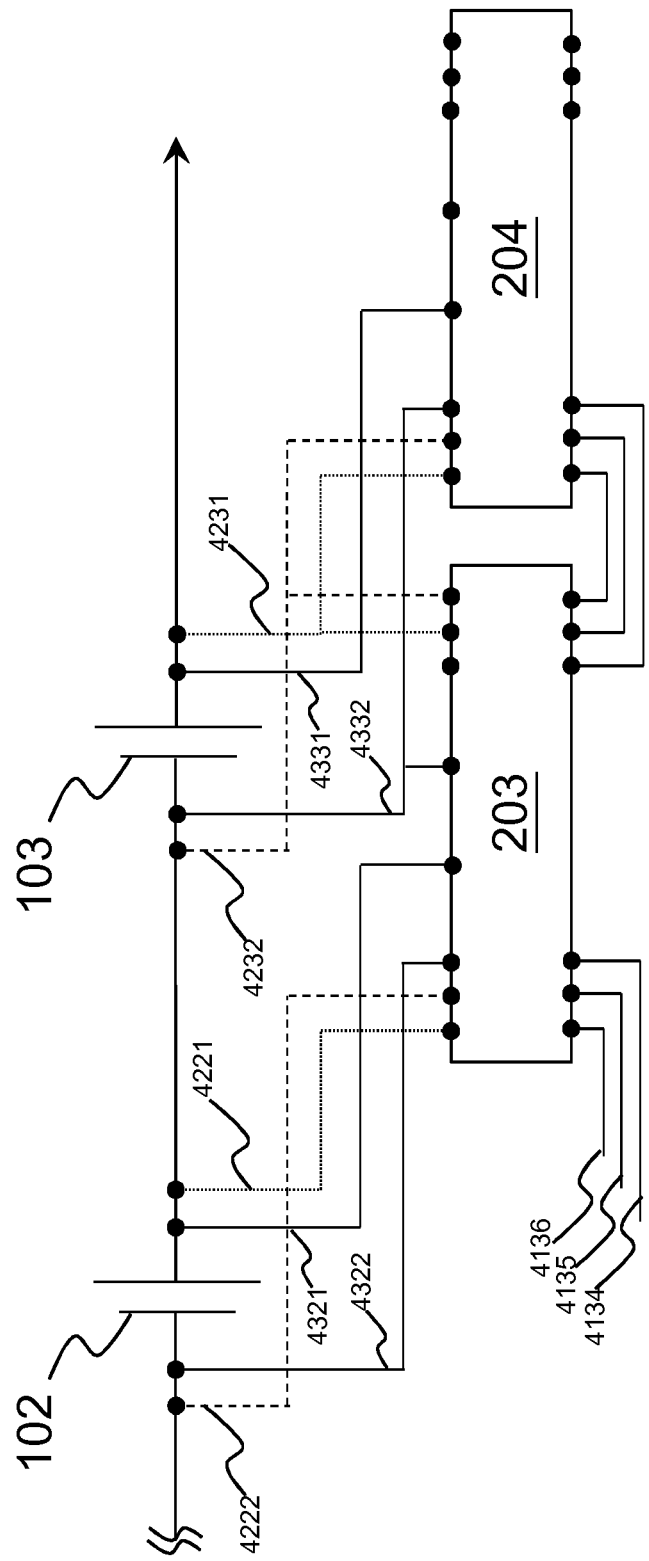
FIG. 5 is a block diagram of still another portion of the system.

Please refer to FIG. 4. The first integrated circuit 201 and second integrated circuit 202 are linked to communication in between. Please notice that there is no other integrated circuit linked to the upstream side of the first integrated circuit 201. The way communication channels are built has been described above. The first integrated circuit 201 links to an upstream output line 4114, an upstream input line 4115, and an upstream clock line 4116 to communicate with the controller 300. The controller 300 will initiate a clock signal to the first integrated circuit 201 via the upstream clock line 4116 and then the clock signal will be passed down to all integrated circuits. The clock signal can trigger data transmitting and receiving of the requiring command, reply message or response message between integrated circuits.

The requiring command is requested from the controller 300 via the upstream input line 4115 to the second integrated circuit 202. After the clock signal is applied to all integrated circuits, the controller 300 sends the requiring command for battery management purpose. For example, if the controller 300 asks to get battery status of the second battery cell 102, the requiring command will carry this message and be passed to a data transceiving unit (not shown) of the first integrated circuit 201. Since the first integrated circuit 201 doesn't detect the second battery cell 102, the requiring command will be passed to a data transceiving unit (the data transceiving unit 401) in the second integrated circuit 202 (in downstream side) until it reaches the integrated circuits in charge of detecting the second battery cell 102. Then, the data transceiving units in the second integrated circuit 202 and the third integrated circuit 203 will generate a response message containing the battery status of the second battery cell 102. The data transceiving unit of the third integrated circuit 203 will transmit the response message to the data transceiving unit of the second integrated circuit 202. The response message becomes a reply message to the data transceiving unit of the second integrated circuit 202. The data transceiving unit of the second integrated circuit 202 will transmit the reply message after its response message to the data transceiving unit of the first integrated circuit 201. The data transceiving unit of the first integrated circuit 201 will only receive two reply messages from the two integrated circuits in downstream side. Finally, the reply messages will come through the upstream output line 4114 to the controller 300.

Like other integrate circuits, the first integrated circuit 201 obtains power by linking to the first power supply line 4311 and the first ground line 4312. However, only communication between itself and the second integrated circuit 202 is supported by the power from the first battery cell 101. The communication between the first integrated circuit 201 and the controller 300 is achieved by the controller 300. The operation is different from that of the second integrated circuit 202 and third integrated circuit 203.

It is appreciated that the integrated circuits are linked by connecting the data transceiving units via circuitry in a printed circuit board (not shown). The controller 300 can be replaced by any other devices which can provide the same functions. For example, a wireless communication device. In this embodiment, receiving and transmitting of the clock signal, requiring command, reply message or response message conform to Inter-Integrated Circuit protocol. In practice, it can also conform to other communication protocol, such as the Service Provider Interface protocol.

Please refer to FIG. 5. The third integrated circuit 203 and fourth integrated circuit 204 are linked to communication in between. Please notice that there is no other integrated circuit linked to the downstream side of the fourth integrated circuit 204. The way communication channels are built has been described above so that it is not repeated here.

The fourth integrated circuit 204 obtains power by linking to the third power supply line 4331 and third ground line 4332. Since there is no other integrated circuit in downstream side to communicate and no other battery cell to provide power, function of communication to integrated circuit in downstream side is cut off. It means that the fourth integrated circuit 204 stops transmitting the clock signal. Likewise, the fourth integrated circuit 204 is linked to the third anode line 4231 and the third cathode line 4232 to process detecting the third battery cell 103.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A system of communication between stacked integrated circuits powered by different voltage supply levels in a multiple cell-stacked battery pack, comprising:
    a plurality of battery cells, stacked to provide power;
    a plurality of integrated circuits, each linking to at least one of other integrated circuits and comprising:
        a battery detecting unit for monitoring battery statuses of two adjacent battery cells in the plurality of battery cells and retrieving the battery statuses therefrom;
        a data transceiving unit, electrically connected with the battery detecting unit, for receiving a clock signal and a requiring command from an outside device or an integrated circuit linked in upstream side and a reply message from an integrated circuit linked in downstream side, transmitting the reply message and/or a response message to the integrated circuit linked in upstream side, the clock signal to the integrated circuit linked in downstream side and the requiring command to the integrated circuit linked in downstream side if the requiring command needs to send to one integrated circuit in downstream side, and stopping transmitting the clock signal if no other integrated circuit linked in downstream side; and
        a power acquiring unit, electrically connecting with the battery detecting unit and data transceiving unit, for providing power thereto so as to operate the battery detecting unit and data transceiving unit;
    wherein the response message is generated if the requiring command requests, the reply message is sent from another data transceiving unit in one integrated circuit in downstream side, the clock signal, requiring command, reply message and response message are in form of change of voltage levels, and the integrated circuit linked in the end of upstream side receives the clock signal and requiring command from the outside device and transmits the reply message and/or a response message according to the requiring command about the battery statuses to the outside device.

2. The system of communication according to claim 1, wherein the integrated circuits are linked by connecting the data transceiving units via circuitry in a printed circuit board.

3. The system of communication according to claim 1, wherein the power acquiring unit links to the two adjacent battery cells to obtain power.

4. The system of communication according to claim 3, wherein power from one of the linked battery cells supports communicating of the clock signal, requiring command, reply message or response message with one integrated circuit in upstream side while power from the other of the linked battery cells supports communicating of the clock signal, requiring command, reply message or response message with one integrated circuit in downstream side.

5. The system of communication according to claim 1, wherein receiving and transmitting of the clock signal, requiring command, reply message or response message conform to Inter-Integrated Circuit protocol or Service Provider Interface protocol.

6. The system of communication according to claim 1, wherein the data transceiving unit transmits the clock signal, requiring command, reply message or response message by toggling voltage level thereof.

7. The system of communication according to claim 1, wherein the clock signal triggers receiving and transmitting of the requiring command, reply message or response message between integrated circuits.

8. The system of communication according to claim 1, wherein the integrated circuit is packaged or in the form of a die.

9. The system of communication according to claim 1, wherein the outside device is a controller.

* * * * *